United States Patent [19]

Moritz

[11] 4,179,622

[45] Dec. 18, 1979

[54] METHOD AND SYSTEM FOR IN SITU CONTROL OF MATERIAL REMOVAL PROCESSES

[75] Inventor: Holger Moritz, Holzgerlingen, Fed. Rep. of Germany

[73] Assignee: International Business Machines Corporation, Armonk, N.Y.

[21] Appl. No.: 900,028

[22] Filed: Apr. 25, 1978

[30] Foreign Application Priority Data

Jun. 23, 1977 [DE] Fed. Rep. of Germany ....... 2728361

[51] Int. Cl.$^2$ ............................................ G01N 21/30
[52] U.S. Cl. ..................................... 250/571; 156/626
[58] Field of Search ................... 156/626; 96/36, 36.2; 250/571; 356/399, 401; 350/162 R

[56] References Cited

U.S. PATENT DOCUMENTS

| 3,802,940 | 4/1974 | Villers et al. ....................... 156/626 |
| 3,957,376 | 5/1976 | Charsky et al. ..................... 250/550 |
| 4,039,370 | 8/1977 | Kleinknecht ......................... 156/626 |

OTHER PUBLICATIONS

IBM Tech. Disc. Bull., vol. 18, No. 6, Nov. 1975, pp. 1867 to 1870.
IBM Tech. Disc. Bull., vol. 15, No. 11, Apr. 1973, pp. 3532 and 3533.

Primary Examiner—David C. Nelms
Attorney, Agent, or Firm—David M. Bunnell

[57] ABSTRACT

In practice, the development time for a photoresist covered semiconductor wafer exposed by a given mask configuration is established experimentally. It is obvious that this time is only adequate if the other parameters do not change. According to the subject invention the mask is provided with an optical grid. The grid pattern, together with the pattern of the integrated circuit, is transferred by exposure to the photoresist layer covering the semiconductor wafer. During the development process, a light ray is directed onto the area of the wafer which was exposed to the grid pattern and the intensity of the light diffracted in the direction of the 2nd diffraction order is monitored by a light sensor. The slits of the grid may have the same width as the smallest lines of the exposed pattern. In this case, the intensity minimum of the 2nd diffraction order indicates the end of the development process.

17 Claims, 4 Drawing Figures

METHOD AND SYSTEM FOR IN SITU CONTROL OF MATERIAL REMOVAL PROCESSES

BACKGROUND OF THE INVENTION

The invention relates to a method of controlling development or etch processes by measuring radiation intensity changes caused by the workpiece during processing.

During the manufacture of integrated circuits, semiconductor wafers are covered with a radiation sensitive resist layer. Subsequently an image pattern which, in most cases, is very complicated and very finely structured is applied to the resist layer by exposure of the resist layer through masks. Because of the ever increasing packing densities, and since the electrical properties of the integrated circuits making up the final product are, to a considerable degree, dependent on the accurate observance of predetermined line widths and line spacings of the transferred light patterns, the accuracy of the masks employed and the parameters to be observed during exposure are subject to the strictest requirements. It has been found that the very narrow tolerances frequently encountered during the transfer of the light patterns deteriorate in many cases as a result of the development and subsequent etch processes to such an extent that only a small percentage of the integrated circuits manufactured in accordance with this method are serviceable. The deterioration of the tolerances occurring during development or etching is amongst others attributable to the fact that even when precise illumination is used the illumination intensity in the peripheral zone of an exposed area, for example, of a line-shaped area, is, as a rule, substantially lower than in the center. As a consequence, the illumination intensity as a function of the distance from the line center does not follow a rectangular curve but decreases gradually towards the line edges, so that the width of the areas bared by development or etching is largely dependent upon the duration of the development or etch process. Even with an almost rectangular shape of the exposure profiles it is possible, in certain circumstances, to considerably extend the bared areas beyond the exposed areas by what is known as "overetching". The strict requirements to be met with regard to the accuracy of the developed or etched patterns are rendered even stricter by the fact that the manufacture of integrated circuits necessitates a number of exposures in successive process steps.

The development of the exposed photoresist layer is generally controlled by strictly observing a development time predetermined in a series of tests. As in addition to the time, a number of further parameters, such as concentration, purity and temperature of the developer, as well as the composition, purity and thickness of the resist layer, and, above all, the illumination intensity during the exposure of the photoresist layer considerably influence the thickness of the bared lines, even the most accurate process monitoring means will not safely preclude errors.

Therefore, in recent years methods of controlling etch processes have been used to control development processes. It has been found, however, that the methods used to monitor and control etch processes have a number of disadvantages rendering them in many cases unsuitable for the very strict requirements to be observed during the control of etch and development processes. Thus, for example, "IBM Technical Disclosure Bulletin", Vol. 18, No. 6, November 1975, pp. 1867 to 1870, describes a method whereby the reflection of a light beam obliquely incident upon the workpiece is measured and used as a criterion to terminate a development or etch process. This method can only be used to determine the first break-through in an etched layer or the time after which the width of said layer ceases to change but not to determine whether a particular width exists. The same applies to the arrangement described in "IBM Technical Disclosure Bulletin", Vol. 15, No. 11, April 1973, pp. 3532 and 3533, wherein the light penetrating the workpiece, rather than the reflected light, is used to indicate the termination of the etch process.

BRIEF SUMMARY OF THE INVENTION

It is the object of the invention to provide a method of monitoring and controlling development and/or etch processes, which, while using a limited number of apparatus means, permits discontinuing the development or etch process after accurately defined line widths have been obtained, thus largely compensating even for errors encountered during exposure.

In comparison with known methods and arrangements, the method in accordance with the invention has the advantage that, rather than requiring a number of very accurate measurements during development or etching, it measures only the intensity of one or several diffraction orders. On the basis of this measurement it is necessary to change only a single parameter, for example, the development time, to compensate for changes in one or several of the afore-mentioned parameters. This eliminates the need for measuring and controlling a plurality of parameters, so that only a light intensity has to be measured and one parameter has to be controlled. As the "in situ" measuring method does not define one parameter important to the final result of the process but the final result proper, i.e., the line width, the accuracy of the method in accordance with the invention, in spite of the simplicity of the means used, is second to none of the methods previously proposed.

In accordance with the invention, there is provided a system and method of controlling development or etch processes by measuring radiation intensity changes caused by the workpiece during processing, characterized in that, in addition to the pattern to be developed or etched, a grid is transferred to the workpiece, for example, by exposure. A beam of suitable wavelength is directed onto the workpiece in the area of the grid. The position and/or intensity of individual or several diffraction orders of light reflected from the grid pattern is determined or measured, and the results are evaluated as a criterion for controlling the process to be monitored.

DESCRIPTION OF THE DRAWINGS

The invention will be described in detail below by means of drawings in which.

DETAILED DESCRIPTION

Figure 1:
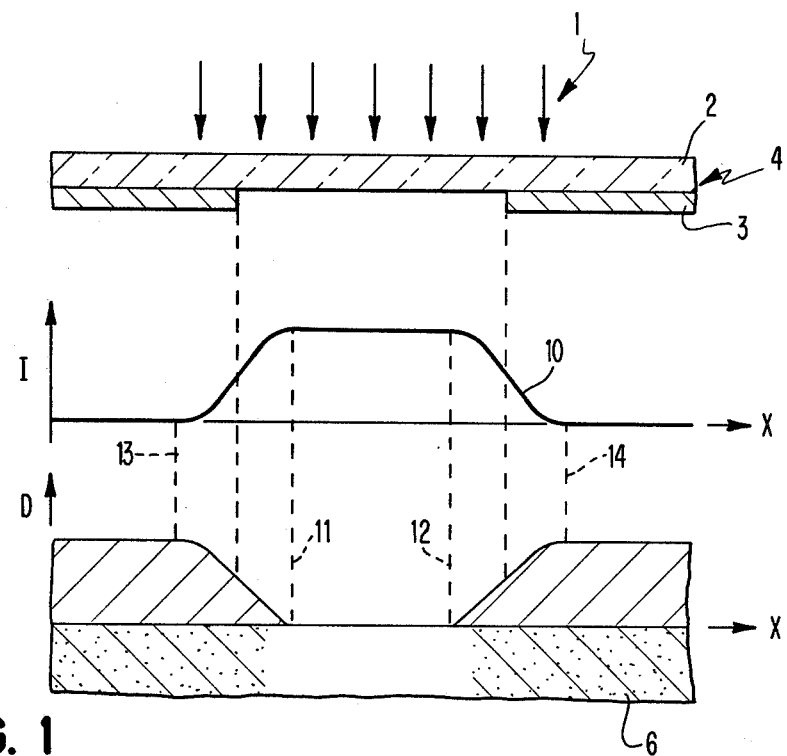
FIG. 1 is a diagrammatic representation of the intensity profile occurring during exposure through a predetermined mask and of the resulting resist thickness profile after completion of the development process.

The exposure of a photoresist layer through a mask will be described by means of FIG. 1. If, as shown in FIG. 1, a collimated radiation 1 impinges upon a mask 4 consisting of a transparent substrate 2 and a non-transparent area 3, an intensity profile marked by line 10 occurs in the area of the resist layer 5 as a result of the diffraction phenomena in the peripheral areas of the non-transparent layer 3. When the resist layer thus exposed is developed, the area of a semiconductor wafer 6 underneath the resist layer between lines 11 and 12 is initially, almost simultaneously, bared after a predetermined time. The width of this area, which changes considerably as a result of fluctuations in the intensity of radiation 1, does not, of course, correspond to the width of the transparent area of mask 4. When the development process is continued, the width of the bared area of semiconductor wafer 6 will become equal to the width of the transparent area of mask 4 after a period of time which can be determined only experimentally. This experimentally determined development time will apply only when all other parameters, such as the exposure intensity, the duration of exposure, the concentration, the purity and the temperature of the developer, as well as the composition, the purity and the thickness of the resist layer can be kept constant with great accuracy. If the development time is increased further or the afore-mentioned parameters change in a particular direction, the bared area of semiconductor wafer 6 will gradually extend across the whole region between lines 13 and 14, extending even further with some photoresists as a result of a further increase in the development time and the "overdeveloping" of the resist this produces. From this it is evident that for the accurate transfer of the transparent areas of mask 4 to occur a number of parameters which are very difficult to monitor have to be very strictly observed. Each change of one of these parameters may decrease or increase the bared areas of semiconductor wafer 6, so that in the worst case areas to be separately doped or conductively coated will be merged with each other or arranged so close together that the electrical characteristics of a semiconductor circuit this produced are changed considerably.

Figure 2:
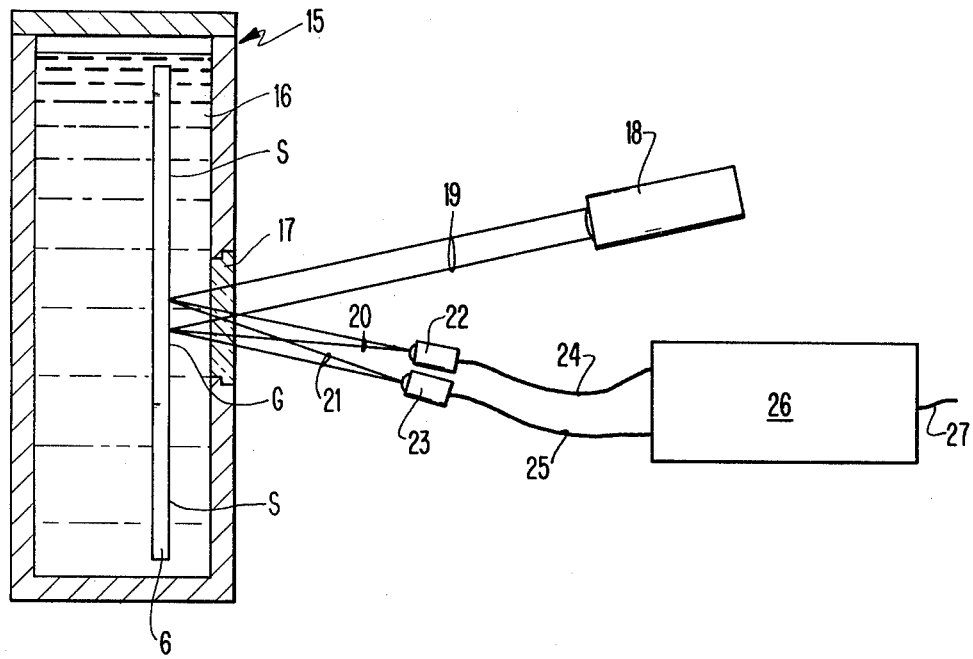
FIG. 2 is a diagrammatic representation of an embodiment of the invention.
Figure 3:
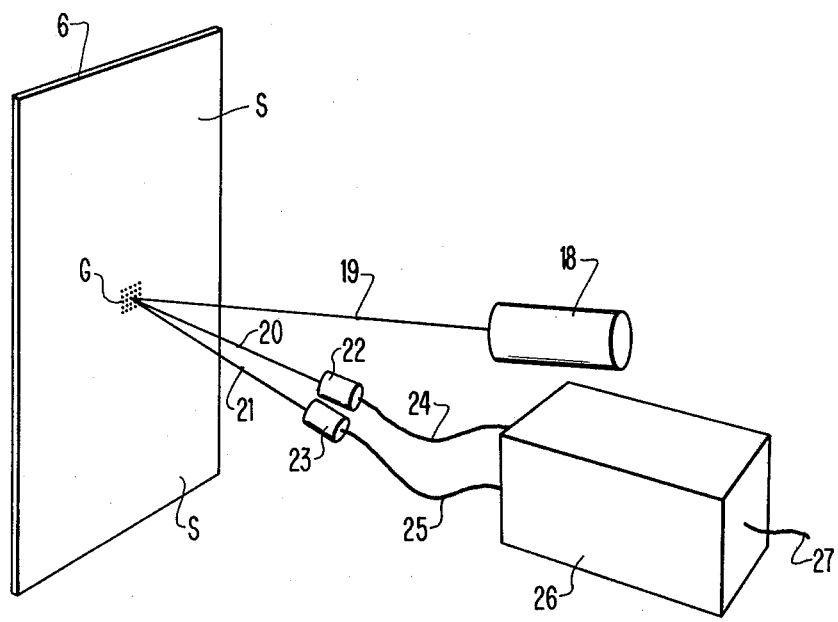
FIG. 3 is a perspective representation of a sectional view of the embodiment shown in FIG. 2.

FIG. 2 is a diagrammatic representation of a simple embodiment of the invention, and FIG. 3 is a perspective sectional view of FIG. 2. The arrangement consists of a tank 15 holding a developer 16. A photoresist coated semiconductor wafer 6, exposed by means of the method illustrated in FIG. 1, is placed in the developer 16. The areas of semiconductor wafer 6 designated as S and shown on a reduced scale and the resist layer covering said areas were exposed with a pattern representing the areas and line structures which are to be differently doped or coated with conductive layers to make up an integrated circuit. The center area of the semiconductor wafer designated to G and its resist cover were exposed with a pattern consisting of a number of lines spaced from each other at predetermined widths and distances. The widths of the lines and the distances between the individual lines of the grid correspond, as a rule, to the main width of the lines and to the distance between the lines in the areas S. These widths and distances can also be greater or smaller than the widths and distances of the lines in area S. Also provided is a light source 18 to generate a monochromatic collimated light beam 19 which through window 17 of tank 15 is incident upon area G of the semiconductor wafer 6, which was exposed with a grid structure. The arrangement also comprises two light detectors 22 and 23 arranged in the direction of the second and the third diffraction orders of radiation 19 incident upon the grid produced by development in area G.

The positions of light detectors 22 and 23 are clearly a function of the grid constant g of the grid resulting in area G. While the position of the diffraction orders at a predetermined direction and wavelength of radiation 19 is clearly a function of grid constant g, i.e., it is process independent, the intensity of these diffraction orders is clearly a function of the width of the line areas bared by means of the development process. If during the development process width b of the areas bared between the grid lines becomes equal to half the grid constant g, i.e., if the line spacings become equal to the line widths, then, as is known from diffraction optics, the intensity of the second order diffraction maximum will become zero. As the slopes of the edges of the grid lines are not exactly perpendicular, the intensity of the second diffraction order will not become zero but will pass a minimum. The curve of this intensity is diagrammatically represented in FIG. 4 as a function of the development time. With extremely finely structured light patterns, whose line widths and line spacings come close to the limit of the optical resolution, it may be advantageous to increase the line widths and spacings of the grid used for process control, in order to prevent the intensity curve of the grids which may be sinusoidal from being falsified in the areas of the second diffraction order or of other diffraction orders. It has been found that for each line width of a circuit pattern to be transferred an optimal grid constant can be experimentally determined, whereby the minimum of particular diffraction orders is a clear criterion for the termination of the development process of the exposed circuit pattern. If the circuit patterns transferred by exposure of the photo-resist have very great line widths and line distances, it may be expedient to reduce the grid constant, thus increasing the accuracy of the indication.

Figure 4:
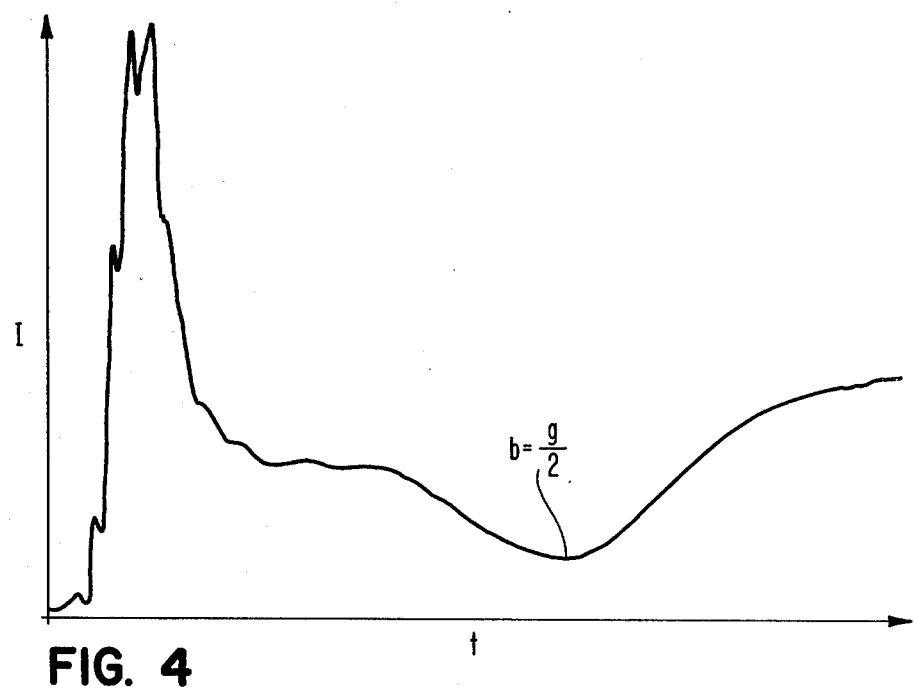
FIG. 4 is the intensity profile of the second order diffraction as a function of the development or etch time.

When the development process has progressed sufficiently far and the grid exposed in area G gradually takes shape, there will be initially no light in the area of the direction of the second diffraction order, for example, as shown in FIG. 4. As the formation of the grid structure progresses, i.e., as the distances between the individual grid lines gradually increase, the intensity in the area of the second diffraction order will increase very rapidly to subsequently decrease rapidly. When the width of the bared areas equals half the grid constant, a minimum value will be reached. If the etch process is continued, the width of the bared areas increases to exceed half the grid constant, so that the intensity of the radiation of the second diffraction order increases gradually. The intensity curve of the second diffraction order is converted into electric signals by means of light detector 22, which are transferred via line 24 to an evaluator circuit 26. To increase the measuring accuracy, it may be expedient to arrange a further light detector 23 in the beam path 21 of the third diffraction order, by means of which the intensity curve of this diffraction order is converted into electric signals which are transferred via line 25 to evaluator circuit 26. Evaluator circuit 26 is designed in such a manner that whenever particular intensity values are reached in the area of one or several diffraction orders, a signal terminating the development process occurs on an output line 27.

The invention is, of course, not limited to patterns transferred by means of masks or other physical masters to be reproduced. It can also be used in connection with patterns generated by means of so-called "artwork" generators which may be designed, for example, as light or electron beam recorders.

What is claimed is:

1. A method of detecting the end point in a process for removing material from a workpiece, said workpiece comprising at least a support layer of one material supporting a top layer of a radiation sensitive material, comprising the steps of:
    a. forming, by exposure to radiation of the radiation sensitive top layer, a grid pattern on the workpiece in addition to the pattern of material to be removed,
    b. positioning the workpiece, in a material removal environment so that said material removal process acts to remove portions of said top layer,
    c. directing a beam of monochromatic radiation onto the grid pattern,
    d. sensing the intensity of a diffraction order of radiation reflected from the grid pattern, and
    e. determining the end point from said intensity.

2. The method of claim 1 wherein the end point corresponds to said intensity reaching a minimum value.

3. Method in accordance with claim 1 wherein the grid pattern is applied to an area which is free from the pattern to be removed.

4. The method in accordance with claim 1 wherein the grid pattern lines have the same widths and spacings as the lines of the patterns to be removed.

5. The method in accordance with claim 1 wherein the grid pattern lines have greater widths and spacings than the lines of the patterns to be removed.

6. The process of claim 1 wherein the top layer is a radiation sensitive resist material and the patterns are formed by exposing the resist material to radiation.

7. The method in accordance with claim 6 wherein the patterns are formed by exposing the resist material with the aid of a mask.

8. The method in accordance with claim 6 wherein the radiation is light or an electron beam.

9. The process of claim 1 wherein the workpiece is a semiconductor wafer.

10. The process of claim 1 including the step of sensing the intensity of the second diffraction order.

11. A system for detecting the end point in a process for removing material from a workpiece comprising:
    a. a grid pattern formed on the workpiece in addition to the pattern of material to be removed,
    b. means for positioning the workpiece in a material removal environment which acts to remove material from the workpiece,
    c. means for directing a beam of monochromatic radiation onto the grid pattern,
    d. means to sense the intensity of a diffraction order of radiation reflected from the grid pattern,
    e. means for determining the end point from said intensity.

12. The system of claim 11 including means for sensing the intensity of the second diffraction order.

13. The system of claim 11 wherein the means for positioning the workpiece in a material removal environment includes a vessel containing an etchant, said vessel having a transparent window to pass said beam of monochromatic radiation.

14. The system of claim 11 wherein said means to sense the intensity, includes a light detector arranged in the direction of the second diffraction order of light incident upon the grid pattern.

15. The system of claim 11 wherein the grid pattern is applied to an area which is free from the pattern to be removed.

16. The system of claim 11 wherein the grid pattern lines have the same widths and spacings as the lines of the patterns to be removed.

17. The system of claim 11 wherein the grid pattern lines have greater widths and spacings than the lines of the patterns to be removed.

* * * * *